(12) United States Patent
Lee et al.

(10) Patent No.: US 7,287,143 B2
(45) Date of Patent: Oct. 23, 2007

(54) SYNCHRONOUS MEMORY DEVICE HAVING ADVANCED DATA ALIGN CIRCUIT

(75) Inventors: Seong-Hoon Lee, Boise, ID (US); Young-Jin Yoon, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 257 days.

(21) Appl. No.: 10/750,602

(22) Filed: Dec. 29, 2003

(65) Prior Publication Data

US 2004/0268016 A1 Dec. 30, 2004

(30) Foreign Application Priority Data

Apr. 30, 2003 (KR) .............. 10-2003-0027633
Apr. 30, 2003 (KR) .............. 10-2003-0027755

(51) Int. Cl.
*G06F 12/00* (2006.01)

(52) U.S. Cl. ..................... 711/167

(58) Field of Classification Search ............ 710/305; 713/400; 711/167; 327/141, 262; 365/219, 365/233

See application file for complete search history.

(56) References Cited

U.S. PATENT DOCUMENTS

| | | | | |
|---|---|---|---|---|
| 5,243,703 A | * | 9/1993 | Farmwald et al. | 713/400 |
| 5,920,511 A | * | 7/1999 | Lee et al. | 365/189.05 |
| 5,923,198 A | * | 7/1999 | Fujioka | 327/262 |
| 6,130,850 A | * | 10/2000 | Ishikawa | 365/219 |
| 6,188,640 B1 | * | 2/2001 | Aikawa et al. | 365/233 |
| 6,240,042 B1 | * | 5/2001 | Li | 365/233 |
| 6,252,441 B1 | * | 6/2001 | Lee et al. | 327/141 |
| 6,260,097 B1 | * | 7/2001 | Farmwald et al. | 710/305 |
| 2001/0004335 A1 | * | 6/2001 | Murakami | 365/233 |

* cited by examiner

*Primary Examiner*—Matthew Kim
*Assistant Examiner*—Paul Schlie
(74) *Attorney, Agent, or Firm*—Blakely Sokoloff Taylor & Zafman (57) ABSTRACT

A semiconductor device for performing an N-bit prefetch operation, N being a positive integer includes a data strobe buffering means for generating N number of align control signals based on a data strobe signal and a external clock signal; a receiving block in response to N−1 number of the align control signals for receiving N-bit data and outputting the N-bit data in a parallel fashion; and a outputting block in response to the remaining align control signal for receiving the N-bit data in the parallel fashion and synchronizing the N-bit data with the remaining align control signal having a N/2 external clock period to thereby generating the synchronized N-bit data as a prefetched data.

18 Claims, 12 Drawing Sheets

SYNCHRONOUS MEMORY DEVICE HAVING ADVANCED DATA ALIGN CIRCUIT

FIELD OF INVENTION

The present invention relates to a synchronous semiconductor memory device; and, more particularly, to an advanced data input buffer which delivers data to an internal circuit by a 4-bit prefetch operation.

DESCRIPTION OF PRIOR ART

Generally, in a Double Data Rate Synchronous Dynamic Random Access Memory (hereinafter, referred as a DDR SDRAM), a method of prefetching 2-bit data or 4-bit data has been used for increasing operation speed of the DDR SDRAM. However, some significant problem is occurred, because there is little timing margin when the DDR SDRAM in accordance with the prior art prefetches each bit of a plural bit data. As a result, in order to increase the operation speed of the DDR SDRAM, the method of prefetching the plural bit data is considered as a limited condition.

Figure 1:
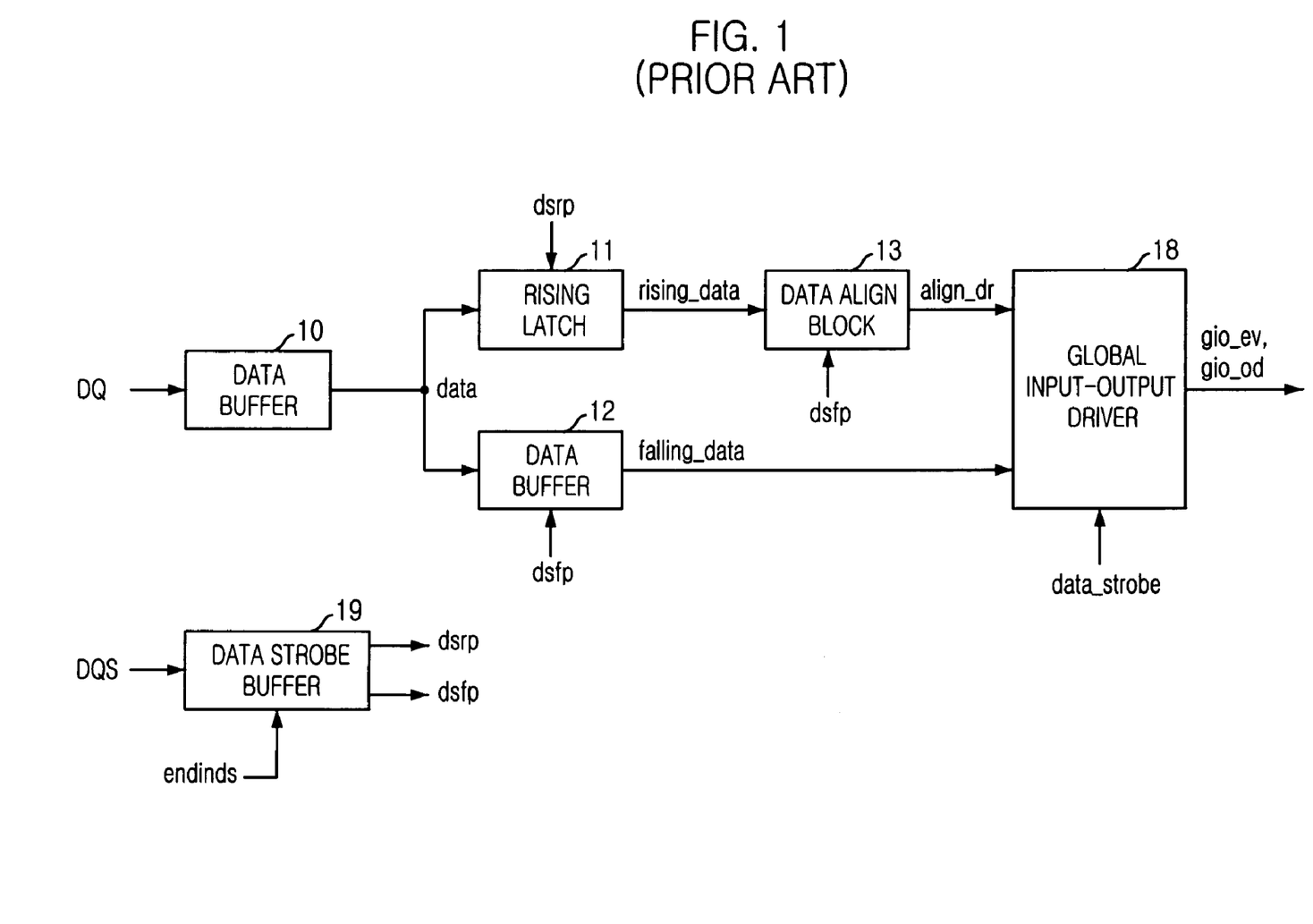
FIG. 1 is a block diagram showing a 2-bit prefetch data input buffer in a conventional synchronous memory device.

FIG. 1 is a block diagram showing a 2-bit prefetch data input buffer in a conventional synchronous memory device.

As shown, the 2-bit prefetch data input buffer of the DDR SDRAM includes a data strobe buffer 19, a data buffer 10, a data rising input latch 11, a data falling input latch 12, a data align block 13 and a global line driving block 18.

The data strobe buffer 19 receives a data strobe signal DQS which is served as a reference signal for arranging inputted data. If a start buffering signal, endinds, is enabled by a data writing instruction, the data strobe buffer 19 outputs a data strobe rising signal, dsrp, and a data strobe falling signal, dsfp. Herein, the start buffering signal, endinds, is used for enabling the data strobe input buffer 19.

The data buffer 10 outputs the inputted data to the data rising input latch 11 and the data falling input latch 12, if a start buffering signal, endinds, is enabled by a data writing instruction.

The data rising input latch 11 receives the data strobe rising signal, dsrp, which is inputted from the data strobe buffer 19 and latches the output of the data buffer 10. The data falling input latch 12 receives the data strobe falling signal, dsfp, which is inputted from the data strobe buffer 19 and latches the output of the data buffer 10. Herein, the data rising input latch 11 controlled by the data strobe rising signal, dsrp, outputs a rising aligned data, rising_data, at the simultaneous timing of outputting a falling aligned data, falling_data, from the data falling input latch 12.

The data align block 13 latches the rising aligned data, rising_data, by the data strobe falling signal, dsfp, in order to output an aligned data, align_dr, which is aligned with the falling aligned data, falling_data. The global line driving block 18 selectively outputs the aligned data, align_dr, and the falling aligned data, falling_data, in response to an internal strobe signal, data_storbe.

Figure 2:
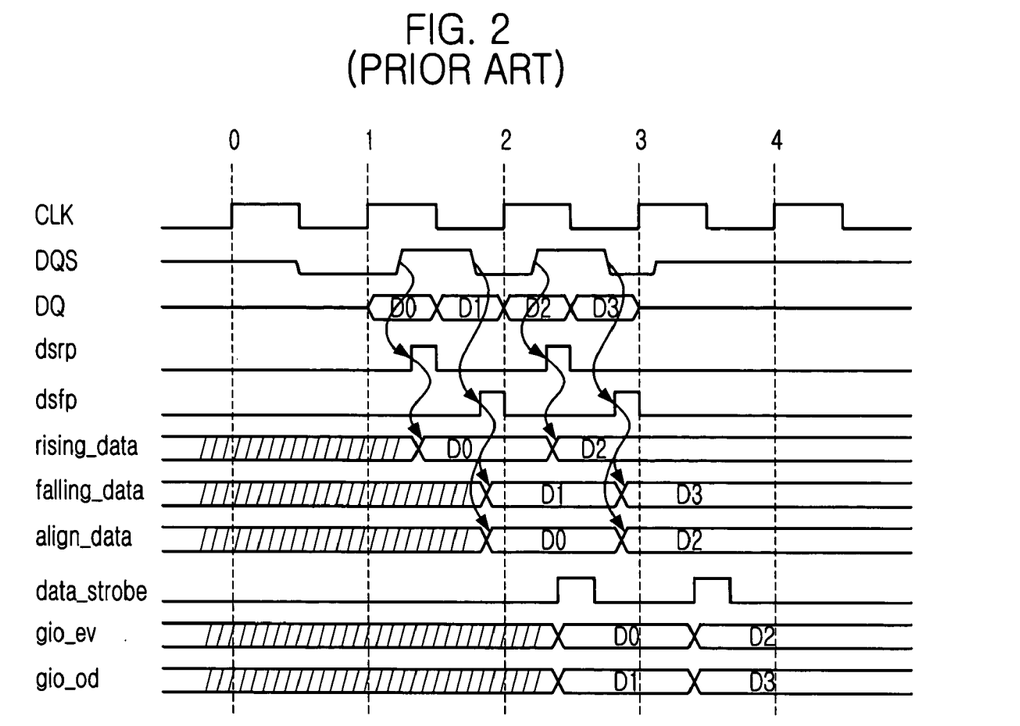
FIG. 2 is a timing diagram demonstrating an operation of the 2-bit prefetch data input buffer shown in FIG. 1.

FIG. 2 is a timing diagram demonstrating an operation of the 2-bit prefetch data input buffer shown in FIG. 1.

As above statement, after receiving the data strobe signal DS, the 2-bit prefetch data input buffer generates the data strobe rising and falling signals, dsrp and dsfp, and outputs first and second aligned data, gio_ev and gio_od in response to the internal strobe signal, data_storbe.

As shown, the 2-bit prefetch data input buffer may have timing margin as long as a half period of an external clock CLK, when the outputted first and second aligned data, gio_ev and gio_od, from the data strobe circuit is synchronized with the external clock CLK. Namely, the first and second aligned data, gio_ev and gio_od, should be outputted by the data strobe falling signal, dsfp, during the half period of the external clock CLK. Generally, when one data strobe signal, e.g., DQS, is inputted to the data strobe circuit, eight data which are synchronized with the data strobe signal are inputted to the data strobe circuit. In case of the data strobe circuit receiving a plurality of data strobe signals, each data strobe signal is inputted not simultaneously but sequentially. As a result, a clock skew between inputted data strobe signals is occurred.

Figure 3:
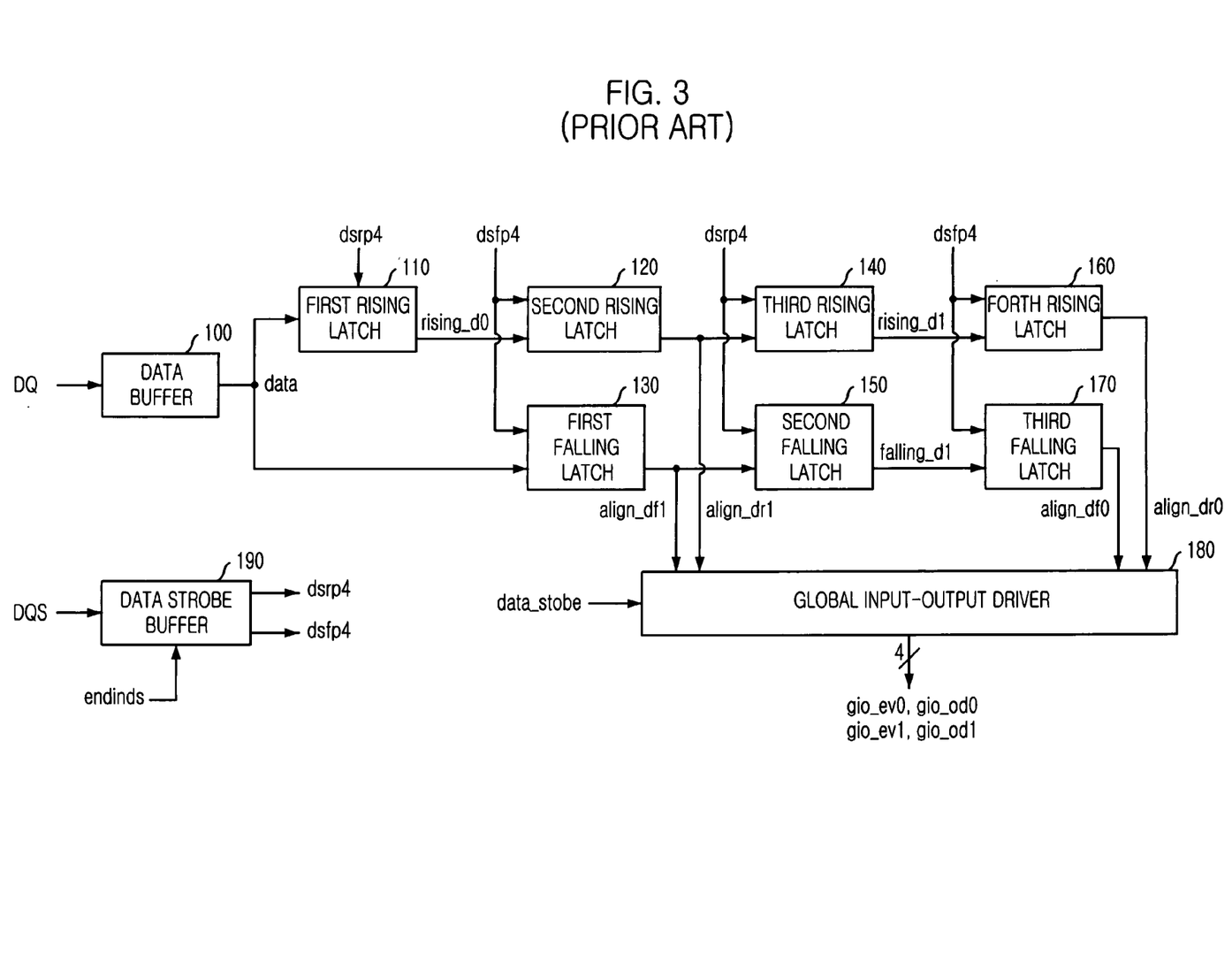
FIG. 3 is a block diagram describing a 4-bit prefetch data input buffer in a conventional synchronous memory device.
Figure 4:
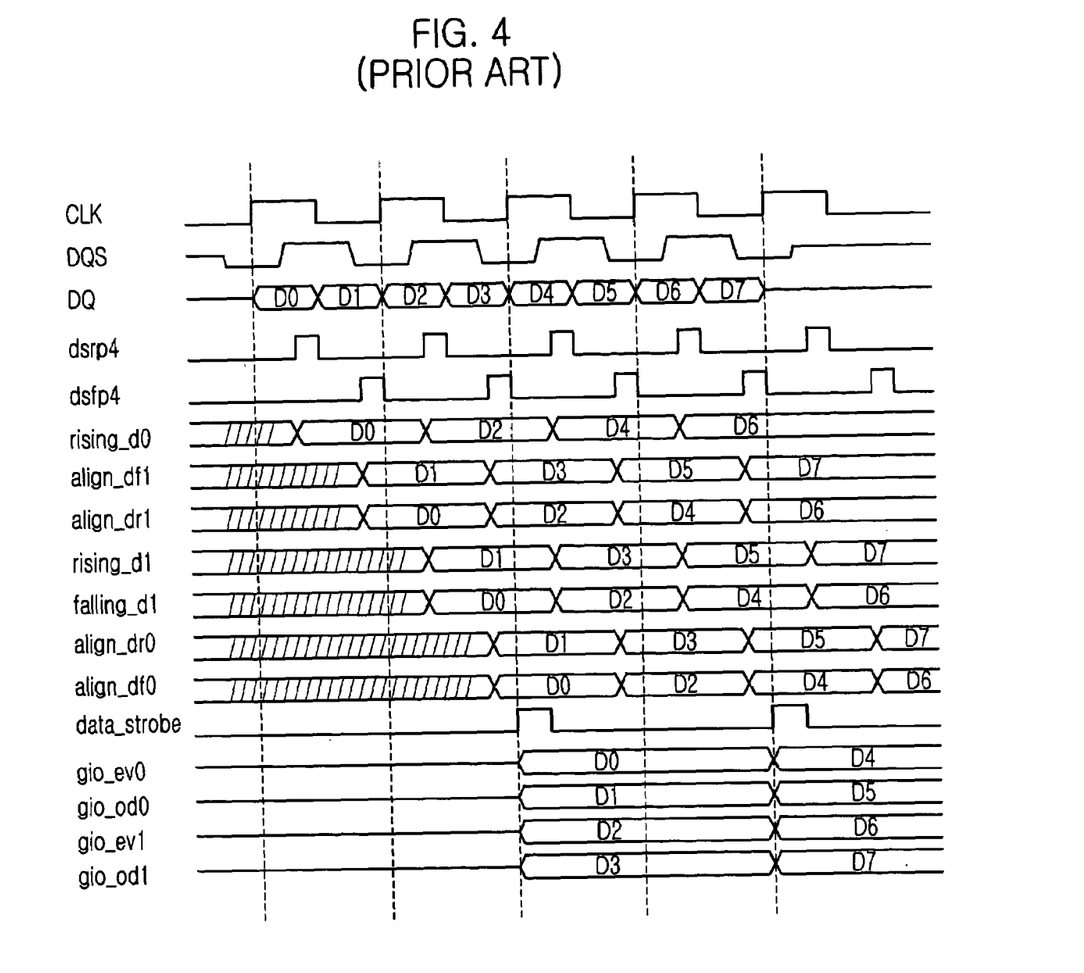
FIG. 4 is a timing diagram demonstrating an operation of the 4-bit prefetch data input buffer shown in FIG. 3.

FIG. 3 is a block diagram describing a 4-bit prefetch data input buffer in a conventional synchronous memory device. FIG. 4 is a timing diagram demonstrating an operation of the 4-bit prefetch data input buffer shown in FIG. 3.

Hereinafter, referring to FIGS. 3 and 4, an operation of the 4-bit prefetch data input buffer is described in detail.

As shown in FIG. 3s, the 4-bit prefetch data input buffer of the DDR SDRAM includes a data strobe buffer 190, a data buffer 100, first to forth data rising input latch 110, 120, 140 and 160, first to third data falling input latch 130, 150 and 170 and a global line driving block 180.

The data strobe buffer 190 receives a data strobe signal DQS which is served as a reference signal for arranging inputted data. If a start buffering signal, endinds, is enabled by a data writing instruction, the data strobe buffer 190 outputs a data strobe rising signal, dsrp4, and a data strobe falling signal, dsfp4. Herein, the start buffering signal, endinds, is used for enabling the data strobe input buffer 190.

The data buffer 100 outputs the inputted data to the first data rising input latch 110 and the first data falling input latch 130, if a start buffering signal, endinds, is enabled by a data writing instruction.

The first data rising input latch 110 receives the data strobe rising signal, dsrp4, which is inputted from the data strobe buffer 190 and latches the output of the data buffer 100. The first data falling input latch 130 receives the data strobe falling signal, dsfp4, which is inputted from the data strobe buffer 190 and latches the output of the data buffer 100. Herein, the first data rising input latch 110 controlled by the data strobe rising signal, dsrp4, outputs a first rising latched data, rising_d0.

The second data rising input latch 120 latches the first rising latched data, rising_d0, by the data strobe falling signal, dsfp4, in order to output an second rising aligned data, align_dr1, which is aligned with the second falling aligned data, align_df1.

The third data rising input latch 140 receives the data strobe rising signal, dsrp4, which is inputted from the data strobe buffer 190 and latches the output of the second data rising input latch 120, i.e., the second rising aligned data, align_dr1. The second data falling input latch 150 receives the data strobe falling signal, dsfp4, which is inputted from the data strobe buffer 190 and latches the output of the first data rising input latch 130, i.e., the second falling aligned data, align_df1. Herein, the third data rising input latch 140 controlled by the data strobe rising signal, dsrp4, outputs a second rising latched data, rising_d1. Also, the second data rising input latch 150 controlled by the data strobe rising signal, dsrp4, outputs a first falling latched data, falling_d1.

The forth data rising input latch 160 latches the second rising latched data, rising_d1, by the data strobe falling signal, dsfp4, in order to output an first rising aligned data, align_dr0. The third data falling input latch 170 latches the first falling latched data, falling_d1, by the data strobe falling signal, dsfp4, in order to output an first falling aligned data, align_df0, which is aligned with the first falling aligned data, align_dr0.

The global line driving block 180 selectively outputs the first and second rising aligned data, align_dr0 and align_dr1, and the first and second falling aligned data, align_df0 and align_df1, in response to an internal strobe signal, data_storbe.

As above statement, after receiving the data strobe signal DS, the 4-bit prefetch data input buffer generates the data strobe rising and falling signals, dsrp4 and dsfp4, and outputs first and second even aligned data, gio_ev0 and gio_ev1, and first and second odd aligned data, gio_od0 and gio_od1, in response to the internal strobe signal, data_storbe.

Figure 5:
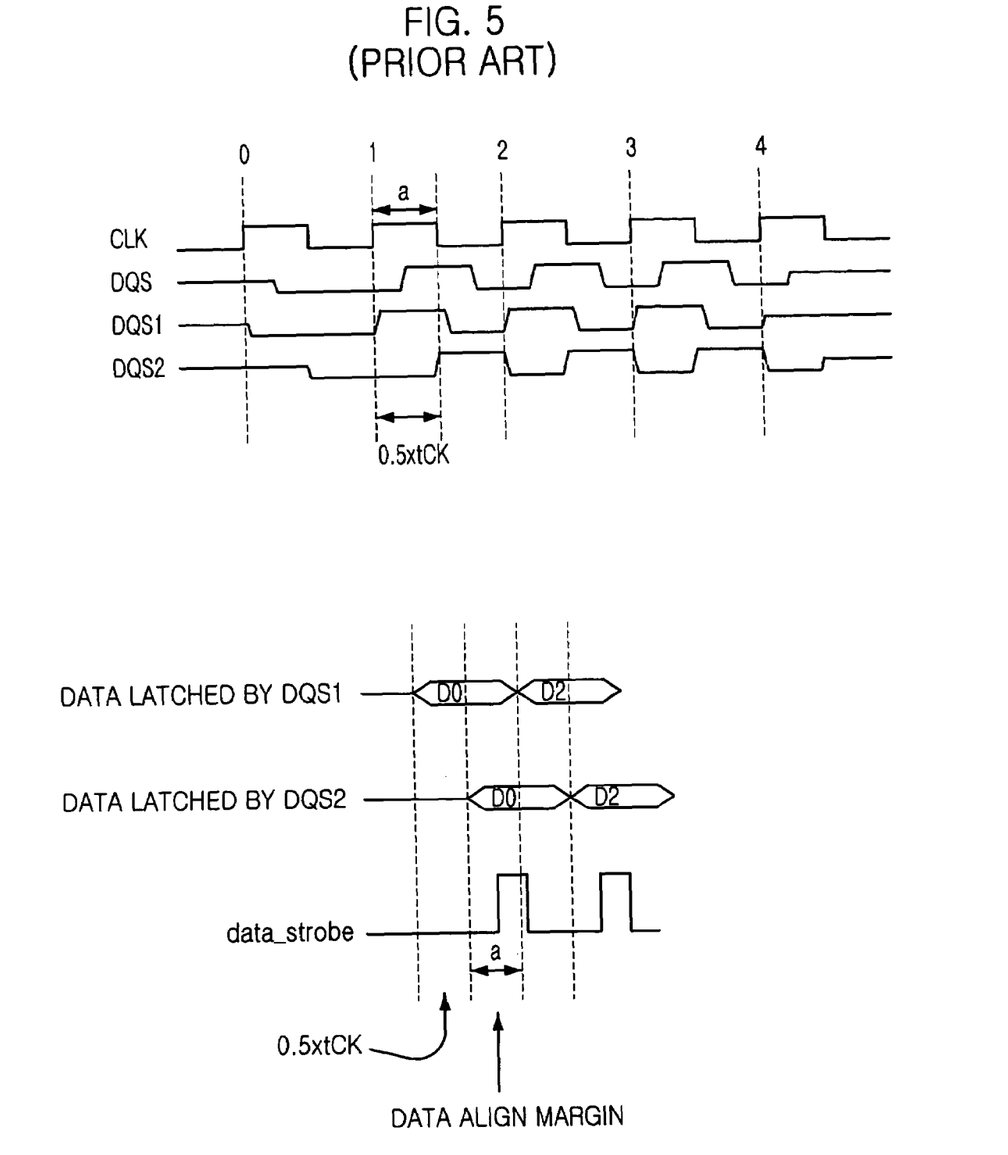
FIG. 5 is a timing diagram depicting a disadvantage of the operation demonstrated in FIG. 4.

FIG. 5 is a timing diagram depicting a disadvantage of the operation demonstrated in FIG. 4. In detail, FIG. 5 is a timing diagram demonstrating data strobe signals, e.g., DQS, $DQS_1$, $DQS_2$, as compared with the external clock CLK.

The timing margin between the data strobe signals may be defined by using the tDQSS, i.e., time from a rising edge of the external clock CLK to a first rising edge of the data strobe signal. For instance, the first data strobe signal DQS1 which is the earliest may be enabled past 0.75 tCK after a writing instruction is inputted. Herein, 1 tCK means one period of the external clock CLK. The second data strobe signal DQS2 which is the latest may be enabled past 1.25 tCK after the writing instruction is inputted. Namely, the data strobe signals are inputted at different timings in response to circumstances, not at a simultaneous timing.

In the case shown in FIG. 5, first and second aligned data which are arranged by each data strobe signal have the timing margin as long as 0.5 tCK. As a result, the latest data among a plurality of data inputted by a first writing instruction should be latched by not a control signal of clock domain but the data strobe signal, before the earliest data among a plurality of data is inputted by a second writing instruction. Namely, each aligned data has 0.5 tCK timing margin as a reference clock for operation is changed from the data strobe signal DS into the external clock CLK.

Therefore, the shorter one period, i.e., 1 tCK, of the external clock CLK is, the shorter the timing margin, i.e., 0.5 tCK, of each aligned data is; and the data strobe circuit of the prior art is not suited to high speed operation of semiconductor memory device by using a high frequency.

SUMMARY OF INVENTION

It is, therefore, an object of the present invention to provide a semiconductor memory device having an advanced data input buffer which delivers data to an internal circuit by a 4-bit prefetch operation in order to guarantee enough timing margin of data arranging operation.

In accordance with an aspect of the present invention, there is provided a semiconductor device for performing an N-bit prefetch operation, N being a positive integer including a data strobe buffering means for generating N number of align control signals based on a data strobe signal and a external clock signal; a receiving block in response to N−1 number of the align control signals for receiving N-bit data and outputting the N-bit data in a parallel fashion; and a outputting block in response to the remaining align control signal for receiving the N-bit data in the parallel fashion and synchronizing the N-bit data with the remaining align control signal having a N/2 external clock period to thereby generating the synchronized N-bit data as a prefetched data.

BRIEF DESCRIPTION OF DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor device having an advanced data input buffer according to the present invention will be described in detail referring to the accompanying drawings.

Figure 6:
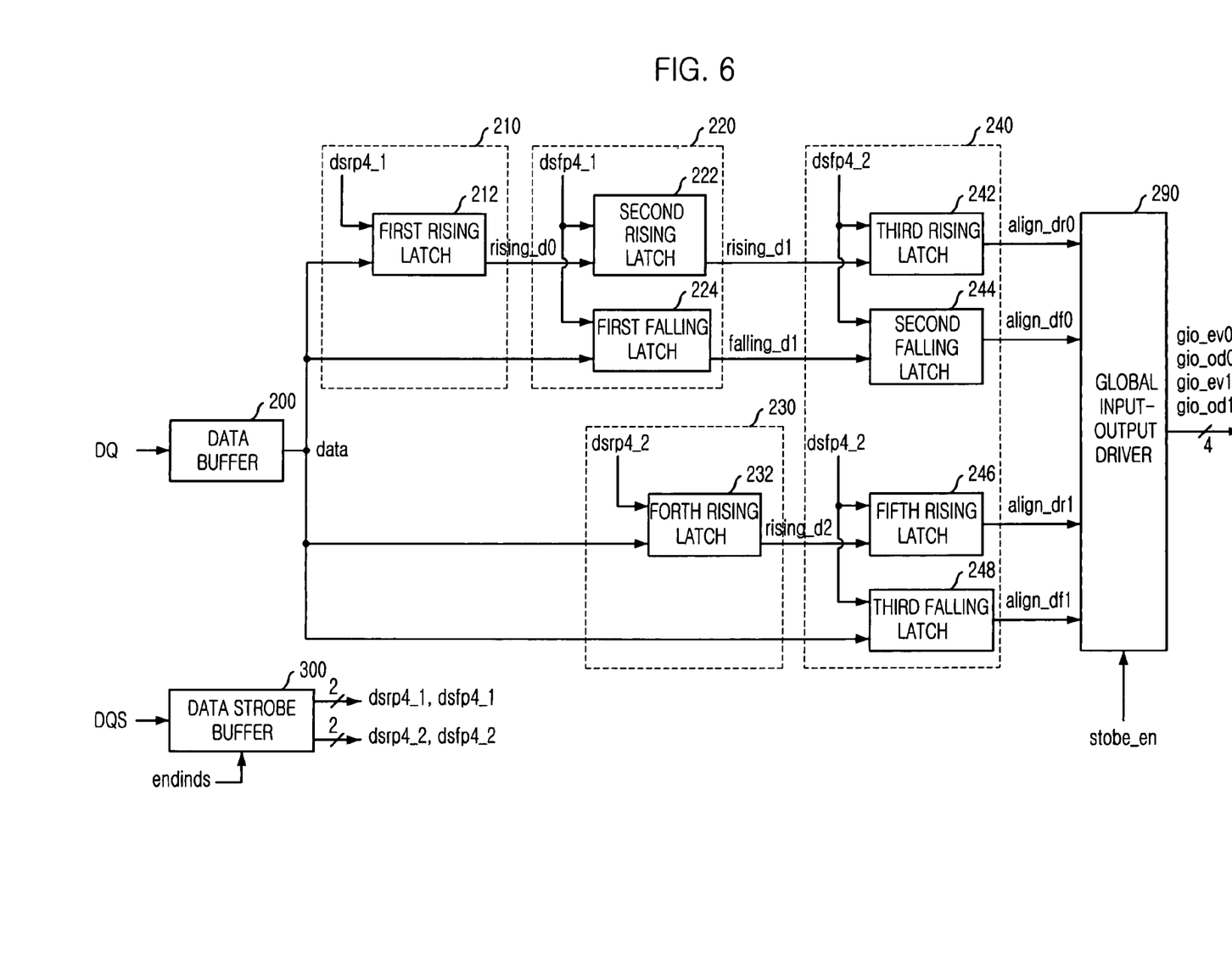
FIG. 6 is a block diagram describing a 4-bit prefetch data input buffer in a synchronous memory device in accordance with an embodiment of the present invention.

FIG. 6 is a block diagram describing a 4-bit prefetch data input buffer in a synchronous memory device in accordance with an embodiment of the present invention.

As shown, the 4-bit prefetch data input buffer includes a data buffer 200, first to third latch block 210 to 230, a output block 240, a global I/O driver 290 and a data strobe buffer 300.

After receiving the strobe signal, the data strobe buffer 300 generates first rising and falling data strobe signals, dsrp4_1 and dsfp4_1, in response to first rising and rising edges of a strobe signal DQS. Continuously, the data strobe buffer 300 generates second rising and falling data strobe signals, dsrp4_2 and dsfp4_2, in response to second rising and falling edges of the strobe signal. Meanwhile, a data sequence DQ is buffered and inputted through the data buffer 200.

The first latch block 210 receives first and second data synchronized with first rising and falling edges of an external clock. In addition, the third latch block 230 receives third and forth data synchronized with second rising and falling edges of the external clock.

In detail, the first latch block 210 includes a first rising latch 212 for synchronizing the first data with the first rising data strobe signal, dsrp4_1. The second latch block 220 includes a second rising latch 222 and a first falling latch 224. Then, the second rising latch 212 receives the latched first data, rising_d0, outputted from the first rising latch 211 and synchronizes the latched first data, rising_d0, with the first falling data strobe signal, dsfp4_1. Herein, an outputted signal from the second rising latch 212 is defined as a first synchronized signal, rising_d1. Likewise, the first falling latch 213 receives the second data and synchronizes the second data with the first falling data strobe signal, dsfp4_1. Herein, an outputted signal from the first falling latch 213 is defined as a second synchronized signal, falling_d1.

In the third latch block 230, a forth rising latch 232 synchronizes the third data with the second rising data strobe signal, dsrp4_2 to output the synchronized data as a third synchronized data.

For the sake of a 4-bit prefetch operation, since 4 bit data, e.g., rising_d1 and falling_d1, should be synchronized with the second falling data strobe signals, dsfp4_2, the output block 240 has third and fifth rising latches 242 and 246 and second and third falling latches 244 and 248. Namely, the third rising latch 242 synchronizes the first synchronized data, rising_d1, with the second falling data strobe signals, dsfp4_2, and the second falling latch 244 synchronizes the second synchronized data, falling_d1, with the second falling data strobe signals, dsfp4_2. Thus, the second latch block 220 outputs first and second aligned data, align_dr0 and align_df0, synchronized with the second falling data strobe signals, dsfp4_2, to the global I/O driver 290.

In addition, the output block 240 includes a fifth rising latch 246 and a third falling latch 248 to output third and forth aligned data, align_dr1 and align_df1, synchronized with the second falling data strobe signals, dsfp4_2, to the global I/O driver 290.

The global I/O driver 290 receives the first to forth aligned data, align_dr0, align_df0, align_dr1 and align_df1 and outputs the four aligned data in response to a strobe enable signal, strobe_en, based on the external clock (not shown).

Figure 7:
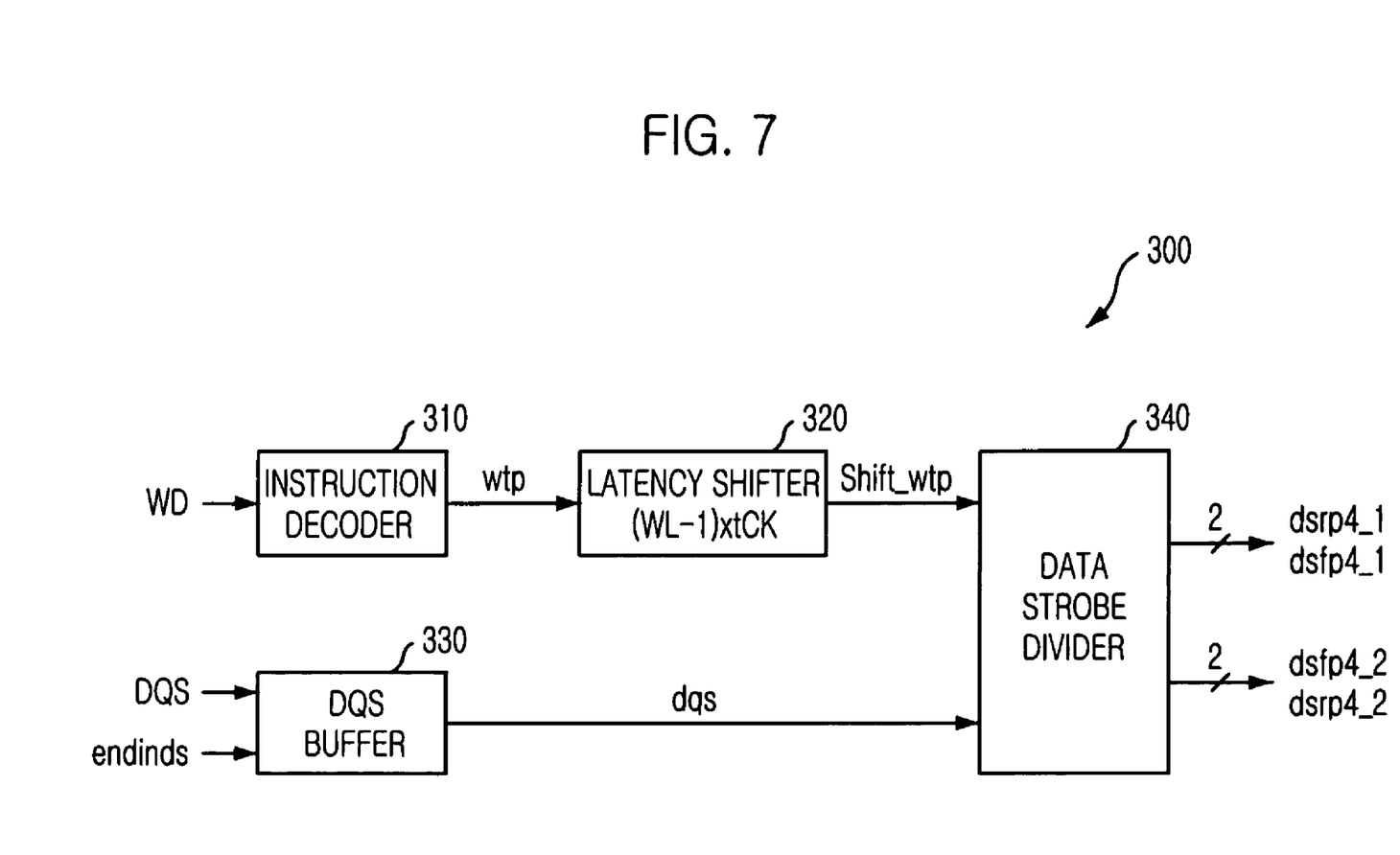
FIG. 7 is a block diagram describing a data strobe buffer shown in FIG. 6.

FIG. 7 is a block diagram describing the data strobe buffer 300 shown in FIG. 6.

As shown, the data strobe buffer 300 has an instruction decoder 310 and a data strobe divider 340.

The instruction decoder 310 is for generating an initialization pulse in response to a writing instruction. The initialization pulse is used for initializing the data strobe divider 340. The data strobe divider 340 receives the strobe signal sequence DQS and generates the first rising and falling data strobe signals, dsrp4_1 and dsfp4_1, and the second rising and falling data strobe signals, dsrp4_1 and dsfp4_1, in response to the strobe signal sequence DQS.

The data strobe buffer 300 further includes a latency shifter 320 allocated between the instruction decoder 310 and the strobe divider 340 in order to delaying the initialization pulse for a predetermined time. Herein, the predetermined time is shorter than a write latency, i.e., a latency from inputting a writing instruction to inputting data. If the write latency is WL cycles, the predetermined time is (WL−1) cycles.

In addition, the data strobe buffer 300 further includes a DQS buffer for receiving the strobe signal sequence DQS and outputting the strobe signal sequence DQS to the strobe signal divider 340. The DQS buffer 330 is enabled by a buffer enabling signal, endinds, based on the writing instruction.

Figure 8:
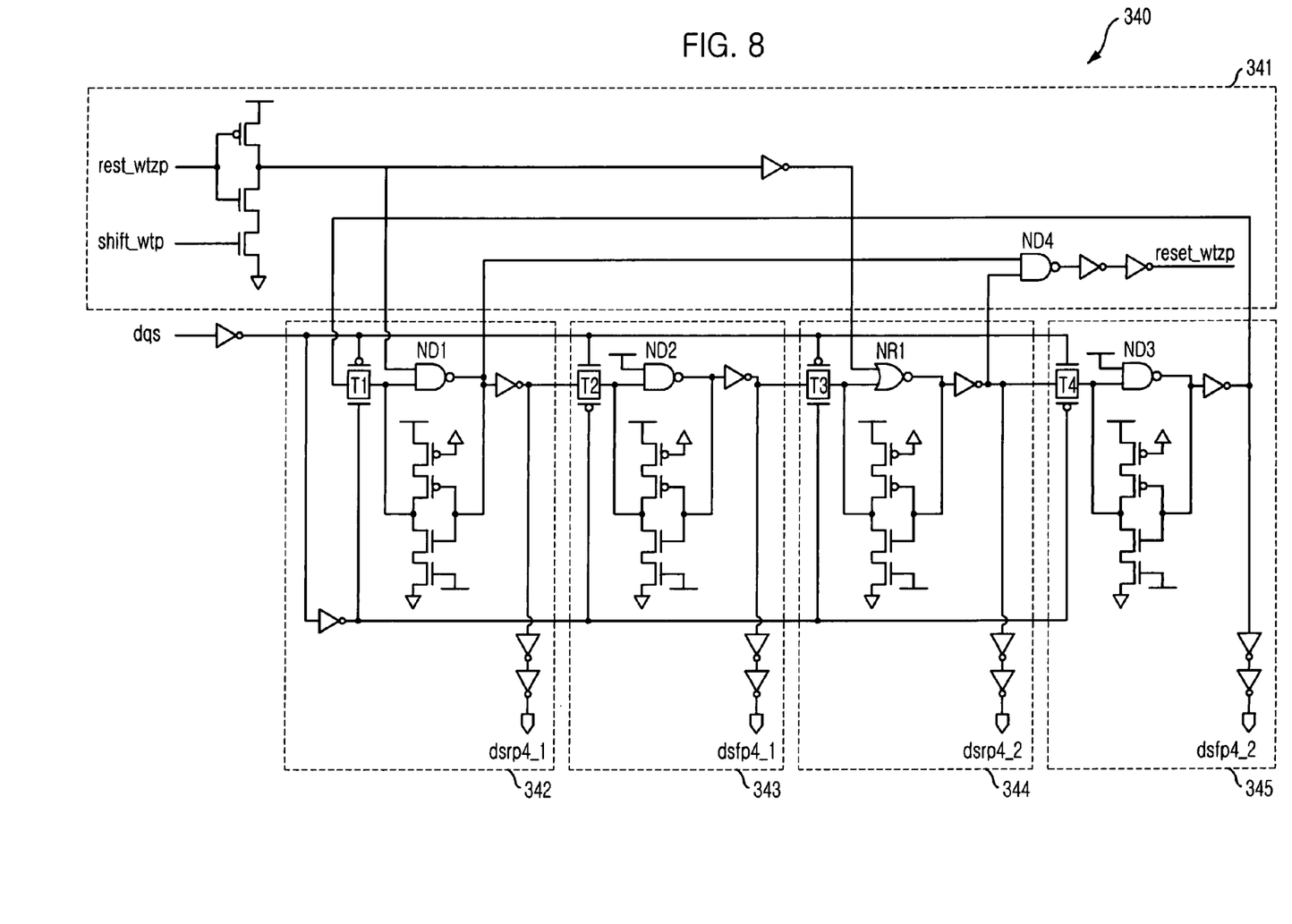
FIG. 8 is a schematic circuit diagram showing a data strobe divider shown in FIG. 7.

FIG. 8 is a schematic circuit diagram showing the data strobe divider shown 340 in FIG. 7.

The strobe signal divider 340 includes an initial setting block 341 and first to forth strobe pulse generators 342 to 345. Each strobe pulse generator is for respectively receiving the strobe signal sequence and individually generating the first rising and falling data strobe signals and the second rising and falling data strobe signals. For instance, the first strobe pulse generator 342 receives the strobe signal sequence, dqs, and outputs the first rising data strobe signal, dsrp4_1. The initial setting block 341 receives a delayed initialization pulse, Shift_wtp, i.e., output signal of data strobe buffer 300 and initializes the first to forth strobe pulse generators 342 to 345.

Figure 9:
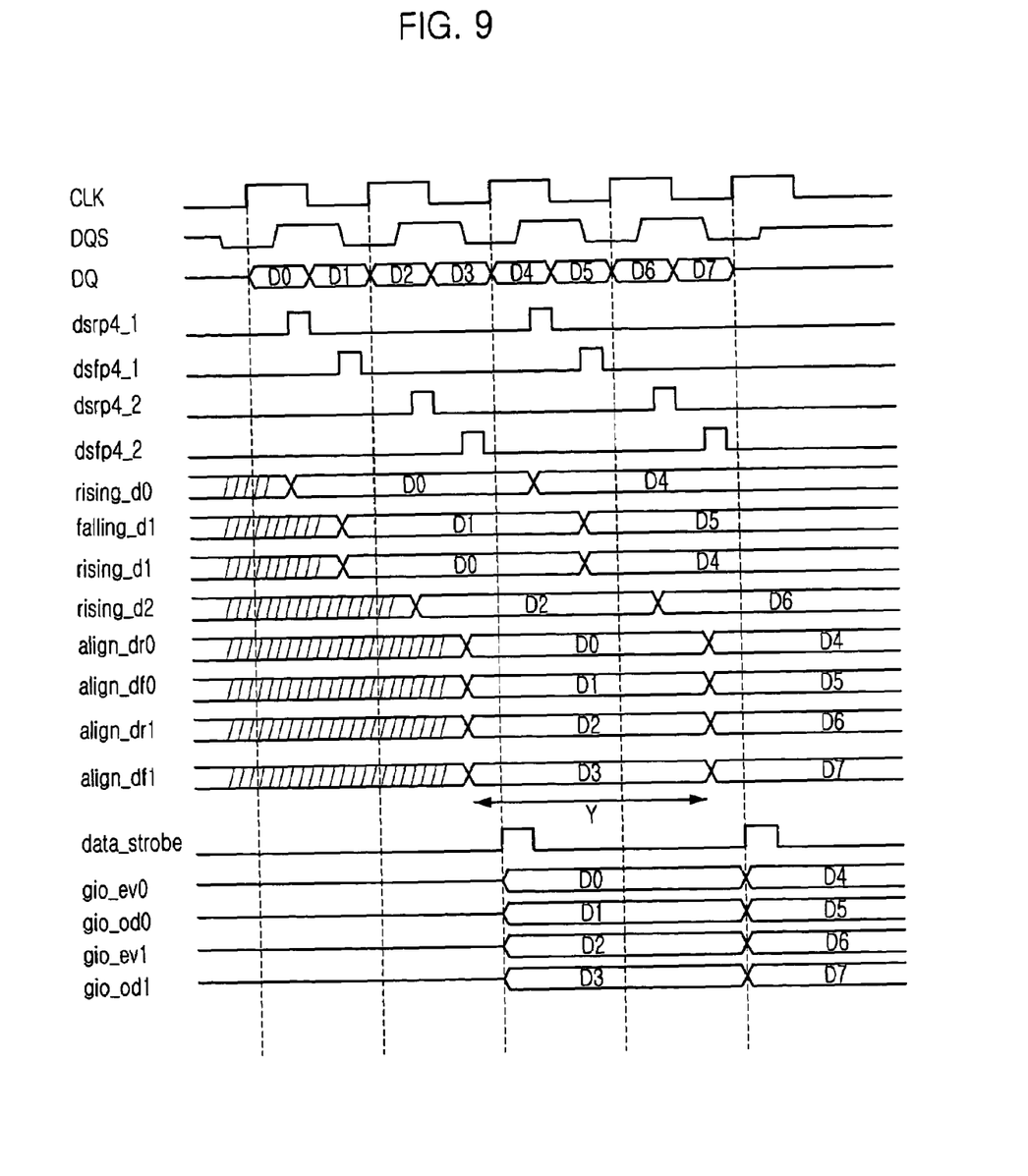
FIG. 9 is a timing diagram demonstrating an operation of the 4-bit prefetch data input buffer shown in FIG. 6.

FIG. 9 is a timing diagram demonstrating an operation of the 4-bit prefetch data input buffer shown in FIG. 6.

As shown, the data sequence DQ synchronized with the external clock CLK is inputted. The data sequence DQ has a plurality of data, e.g., D0. Each data is inputted during a half period of the external clock CLK. For example, during two period of the external clock CLK, four data D0 to D4 synchronized with rising and falling edges of the external clock CLK are inputted to the data buffer 200.

The data strobe buffer 300 enabled by the buffer enabling signal, endinds, generates the first rising data strobe signal, dsrp4_1, in response to a first rising edge of the external clock CLK. Continuously, the first falling data strobe signal, the second rising data strobe signal and the second falling data strobe signal, dsfp4_1, dsrp4_2 and dsfp4_2, are respectively generated in response to a first falling edge, a second rising edge and a second falling edge of the external clock CLK.

Thereafter, by the first rising latch 212 in the first latch block 210, the first data D0 is converted into the latched first data, rising_d0, synchronized with the first rising data strobe signal, dsrp4_1. Then, the latched first data, rising_d0, is changed into the first synchronized data, rising_d1, synchronized with the first falling data strobe signal, dsfp4_1. Likewise, the second data D1 is converted into the second synchronized data, falling_d1, synchronized with the first falling data strobe signal, dsfp4_1.

Through the output block 240, the first and second synchronized data, rising_d1 and falling_d1, is changed into the first and second aligned data, align_dr0 and align_df0, synchronized with the second falling data strobe signal, dsfp4_2.

In addition, the third and forth data D3 and D4 is converted into the third and forth aligned data, align_dr1 and align_df1, synchronized with the second falling data strobe signal, dsfp4_2, by the output block 240.

As a result, the first to forth data D0 to D3 are respectively changed into the first to forth aligned data, align_dr0, align_df0, align_dr1 and align_df1, synchronized with the second falling data strobe signal, dsfp4_2.

Thereafter, the global I/O driver 290 outputs the first to forth aligned data, align_dr0, align_df0, align_dr1 and align_df1, in response to the data strobe signal, data_strobe. Herein, the data strobe signal should be inputted to the global I/O driver 290 during 'Y' period shown in FIG. 9. If not, the first to forth aligned data can be overwritten by fifth to eighth aligned data converted form fifth to eight data D4 to D7.

Figure 10:
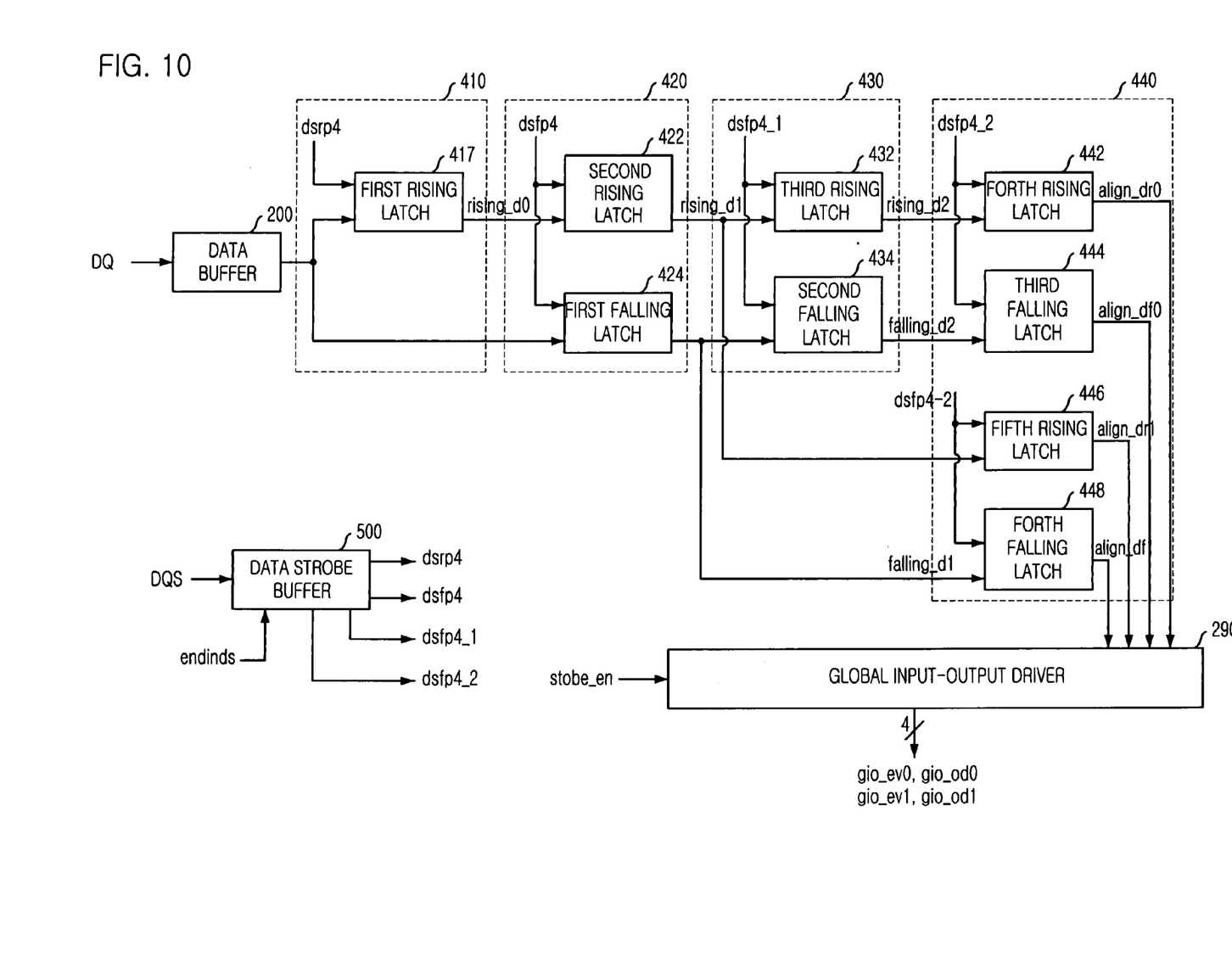
FIG. 10 is a block diagram describing a 4-bit prefetch data input buffer in a synchronous memory device in accordance with another embodiment of the present invention.

FIG. 10 is a block diagram describing a 4-bit prefetch data input buffer in a synchronous memory device in accordance with another embodiment of the present invention.

As shown, the 4-bit prefetch data input buffer includes a data buffer 200, forth to sixth latch blocks 410 to 430, a second output block 440, a global I/O driver 290 and a data strobe buffer 300.

After receiving the strobe signal, the data strobe buffer 500 generates first rising and falling data strobe signals, dsrp4 and dsfp4, in response to first rising and rising edges of a strobe signal DQS. Continuously, the data strobe buffer 500 generates a second falling data strobe signal, dsfp4_1, in response to the first falling data strobe signal, dsfp4. Also, a third falling data strobe signal, dsfp4_2 is generated in response to second falling edges of the strobe signal DQS. Meanwhile, a data sequence DQ is buffered and inputted through the data buffer 200.

The forth latch block 410 receives first to forth data synchronized with rising and falling edges of an external clock. Then, the fifth latch block 420 receives output data from the forth latch block 410, e.g., rising_d1 at the second falling data strobe signal, dsrp4_1. The sixth latch block 430 receives output data from the fifth latch block and synchronizes the data, rising_d1 and falling_d1, with the second falling data strobe signal, dsfp4_1. The second output block 440 receives first and second synchronized data, rising_d2 and falling_d2, outputted from the sixth latch block 430 and third and forth synchronized data outputted from the fifth latch block 420. Then, the second output block 440 synchronizes the first to forth synchronized data with the third falling data strobe signal, dsfp4_2, to output the first to forth synchronized data as a 4-bit prefetched data.

Figure 11:
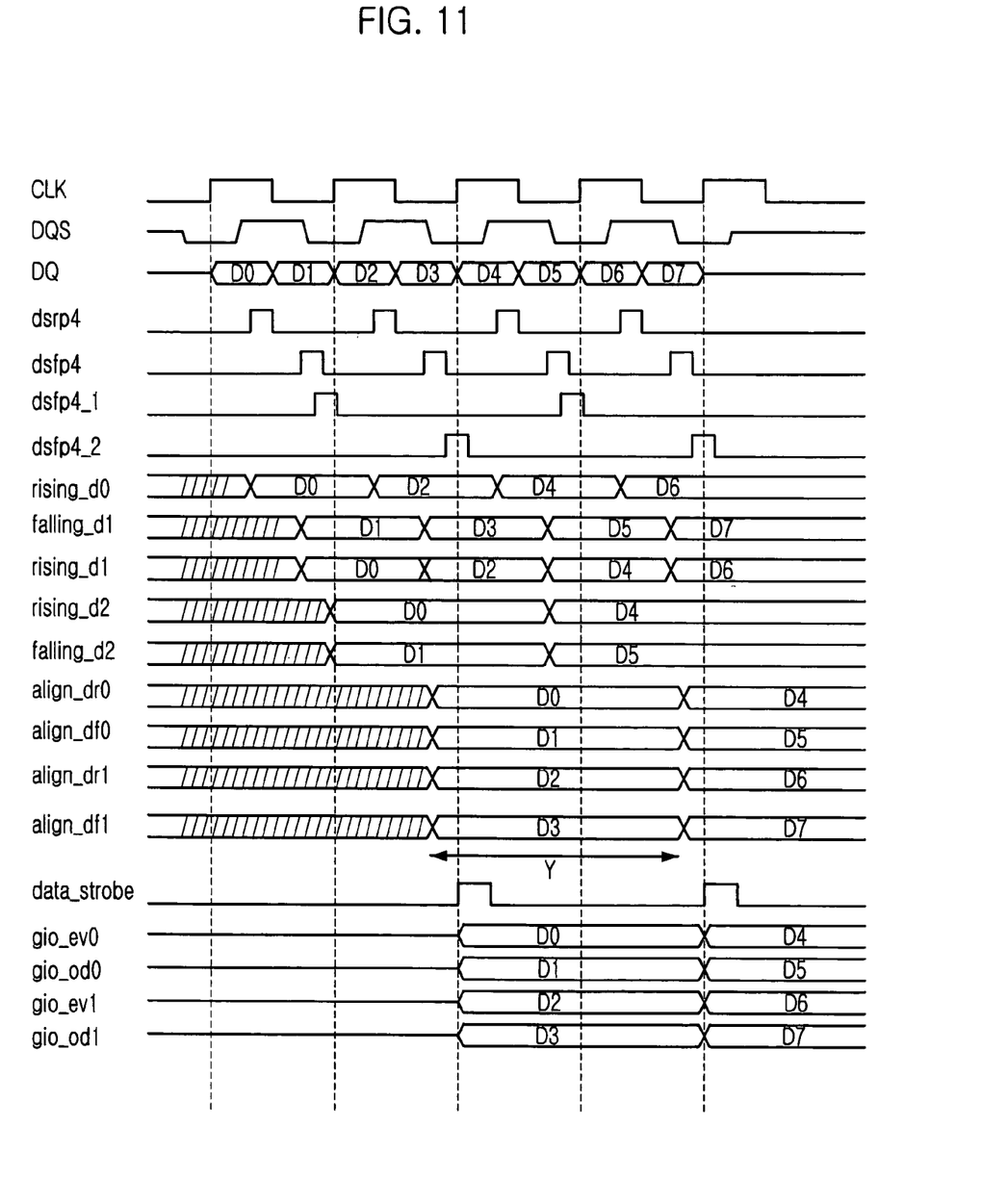
FIG. 11 is a timing diagram demonstrating an operation of the 4-bit prefetch data input buffer shown in FIG. 10.

FIG. 11 is a timing diagram demonstrating an operation of the 4-bit prefetch data input buffer shown in FIG. 10.

Hereinafter, referring to FIGS. 10 and 11, the operation of the 4-bit prefetch data input buffer is described in detail.

The forth latch block 410 includes a first rising latch 412 and the fifth latch block 420 includes a second rising latch 412 and a first falling latch 424. First, the first rising latch 412 synchronizes the first data with the first rising data strobe signal, dsrp4. Then, the second rising latch 422 receives the latched first data, rising_d0, outputted from the first rising latch 412 and synchronizes the latched first data, rising_d0, with the first falling data strobe signal, dsfp4. Herein, an outputted signal from the second rising latch 212 is defined as a synchronized signal, rising_d1. Likewise, the first falling latch 424 receives the second data and synchronizes the second data with the first falling data strobe signal, dsfp4. Herein, an outputted signal from the first falling latch 424 is defined as a second synchronized signal, falling_d1.

Each even data in the first and second synchronized signals, rising_d1 and falling_d1, is latched by the sixth latch block 430 in response to the second falling data strobe signal, dsfp4_1. But, each odd data in the first and second synchronized signals, rising_d1 and falling_d1, is latched by the second output block 440 in response to the third falling data strobe signal, dsfp4_2. The even data latched by the sixth latch block 420 is synchronized with the third falling data strobe signal, dsfp4_2, by the second output block 440.

As shown in FIG. 10, the fifth and sixth latch block 420 to 440 respectively include two latches: one synchronizes the first synchronized signal, rising_d1, with an inputted falling data strobe signal, e.g., dsfp4_1; the other synchronizes the second synchronized signal, falling_d1, with an inputted falling data strobe signal, e.g., dsfp4_1. As a result, the second output block 430 outputs first and second aligned data, align_dr0 and align_df0, synchronized with the third falling data strobe signals, dsfp4_2, to the global I/O driver 290. In addition, the second output block 440 outputs third and forth aligned data, align_dr1 and align_df1, synchronized with the third falling data strobe signals, dsfp4_2, to the global I/O driver 290.

The global I/O driver 290 receives the first to forth aligned data, align_dr0, align_df0, align_dr1 and align_df1 and outputs the four aligned data in response to a strobe enable signal, strobe_en, based on the external clock CLK.

Figure 12:
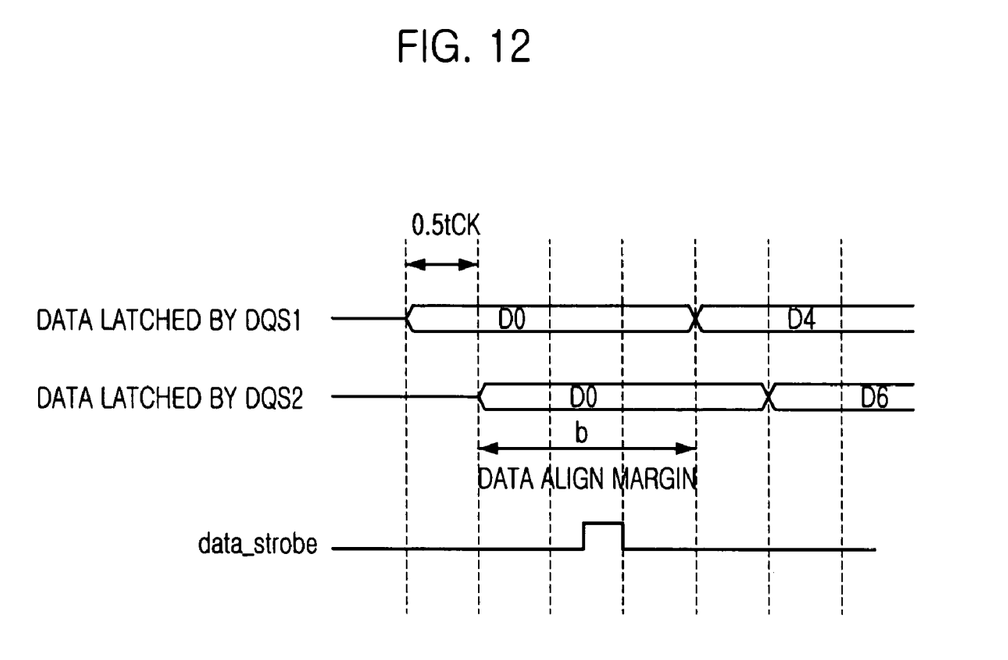
FIG. 12 is a timing diagram depicting an advantage of the operation of the 4-bit prefetch data input buffers demonstrated in FIGS. 9 and 11.

FIG. 12 is a timing diagram depicting an advantage of the operation of the 4-bit prefetch data input buffers demonstrated in FIGS. 9 and 11.

In the conventional semiconductor device, the strobe signal sequence DSQ having a timing margin from (WL−0.25)×tCK to (WL+0.25)×tCK. Herein, WL is the write latency. Thus, the strobe signal sequence DSQ has 0.5×tCK timing margin. Namely, if the write latency WL is 1, the timing margin of the strobe signal sequence DSQ can be in the ranges from 0.75×tCK to 1.25×tCK.

Referring to FIG. 10, there are two data latched by DQS1 and DQS2. Herein, the DQS1 has 0.75×tCK timing margin and the DQS2 has 1.25×tCK timing margin. For outputting the two data D0 to a global I/O line correctly, the data strobe signal, data_strobe, should be inputted during a data aligned margin, i.e., 'b' period. Herein, the data aligned margin is defined as a period when two data latched by the DQS1 and the DQS2 can be commonly accessed.

As shown, the data aligned margin is 0.5×tCK×3. Namely, the data aligned margin according to the present invention is longer three times than that of the prior art. If an operation speed of a memory device is 500 MHz, one period of an external clock tCK is 2.0 nsec. Thus, in this case, a data strobe signal has 3.0 nsec data aligned margin.

The semiconductor memory device having an advanced data input buffer in accordance with the present invention has the advantage of stable writing operation by guaranteeing enough timing margin during a high speed operation.

While the present invention has been described with respect to the particular embodiments, it will be apparent to those skilled in the art that various changes and modification may be made without departing from the spirit and scope of the invention as defined in the following claims.

What is claimed is:

1. A semiconductor device comprising:
a data strobe buffering means for generating N number of align control signals based on a data strobe signal and an external clock signal, including a strobe signal divider for receiving the data strobe signal to generate N number of the align control signals based on the data strobe signal sequence;
a receiving block in response to N−1 number of the align control signals for receiving the plurality of input data and outputting intermediate N-bit data in a parallel fashion; and
an outputting block in response to the remaining align control signal for receiving the intermediate N-bit data in the parallel fashion and outputting the intermediate N-bit data in synchronization with the remaining align control signal having an N/2 external clock period to generate the synchronized intermediate N-bit data as the N-bit output data, wherein the semiconductor device operates to receive a plurality of input data to output the N-bit output data at one clock, N being a positive integer, and N is at least 4,
wherein the data strobe buffering means generates the N number of align control signals, each having an N/2 external clock period, the receiving block includes N−1 number of latch blocks in response to the N−1 number of the align control signals, and the data strobe buffering means includes:
an instruction decoder for generating an initialization pulse for initializing the strobe signal divider in response to the data strobe signal.

2. The semiconductor device as recited in claim 1, wherein the receiving block includes:
a first latching block for receiving 2-bit data and outputting the 2-bit data in synchronization with a first align control signal to generate the first synchronized 2-bit data as a first synchronized data;
a second latching block for receiving the first synchronized data and outputting the first synchronized data in synchronization with a second align control signal to generate the synchronized as some of the intermediate N-bit data; and a third latching block for receiving 2-bit data and outputting the 2-bit data in synchronization with a third align control signal to generate the synchronized 2-bit data as the other of the intermediate N-bit data.

3. The semiconductor device as recited in claim 2, wherein each of the first to third latching blocks includes at least one latch for synchronizing 1-bit data with one of the align control signals.

4. The semiconductor device as recited in claim 1, wherein the strobe signal divider includes:
   first to forth strobe pulse generators, each for receiving the data strobe signal and generating the align control signals based on the strobe signal sequence; and
   an initial setting block for initializing the first to forth strobe pulse generators,
   wherein the align control signal has the N/2 external clock period.

5. The semiconductor device as recited in claim 1, wherein the data strobe buffering means includes a latency shifter coupled between the instruction decoder and the strobe signal divider for delaying the initialization pulse for a predetermined time.

6. The semiconductor device as recited in claim 1, wherein the data strobe buffering means includes a strobe signal buffer for receiving the data strobe signal and outputting the data strobe signal to the strobe signal divider.

7. The semiconductor device as recited in claim 1, wherein the receiving block includes:
   a first latching block for receiving 2-bit data and outputting the 2-bit data in synchronization with a first align control signal to generate the synchronized 2-bit data as a first synchronized data;
   a second latching block for receiving the first synchronized data and outputting the first synchronized data in synchronization with a second align control signal to generate the synchronized data as some of the intermediate N-bit data; and
   a third latching block for receiving the synchronized 2-bit data outputted from the second latching block and outputting the 2-bit data in synchronization with a third align control signal to generate the synchronized 2-bit data as the other of the intermediate N-bit data.

8. The semiconductor device as recited in claim 7, wherein each of the first to third latching blocks includes at least one latch for synchronizing 1-bit data with one of the align control signals.

9. The semiconductor device as recited in claim 1, wherein the data strobe buffering means includes:
   an instruction decoder for generating an initialization pulse for initializing the strobe signal divider in response to the data strobe signal.

10. The semiconductor device as recited in claim 9, wherein the strobe signal divider includes:
    first to forth strobe pulse generators, each for receiving the data strobe signal and generating the align control signals based on the strobe signal sequence; and
    an initial setting block for initializing the first to forth strobe pulse generators,
    wherein the align control signal has the N/2 external clock period.

11. The semiconductor device as recited in claim 9, wherein the data strobe buffering means includes a latency shifter coupled between the instruction decoder and the strobe signal divider for delaying the initialization pulse for a predetermined time.

12. The semiconductor device as recited in claim 9, wherein the data strobe buffering means includes a strobe signal buffer for receiving the data strobe signal and outputting the data strobe signal to the strobe signal divider.

13. The semiconductor device as recited in claim 1, wherein the outputting block includes N number of latches, each for synchronizing the intermediate N-bit data with the remaining align control signal having the N/2 external clock period to generate the synchronized intermediate N-bit data as the N-bit output data.

14. The semiconductor device as recited in claim 1, further comprising a global input-output driver for generating the N-bit output data in response to the strobe enable signal.

15. A semiconductor device comprising:
    a data strobe buffering means for generating N number of align control signals based on a data strobe signal and an external clock signal, including a strobe signal divider for receiving the data strobe signal to generate N number of the align control signals based on the data strobe signal sequence;
    a receiving block in response to N−1 number of the align control signals for receiving the plurality of input data and outputting intermediate N-bit data in a parallel fashion; and
    an outputting block in response to the remaining align control signal for receiving the intermediate N-bit data in the parallel fashion and outputting the intermediate N-bit data in synchronization with the remaining align control signal having an N/2 external clock period to generate the synchronized intermediate N-bit data as the N-bit output data,
    wherein the semiconductor device operates to receive a plurality of input data to output the N-bit output data at one clock, N being a positive integer, and N is at least 4,
    wherein the data strobe buffering means generates the N number of align control signals, at least one having an N/2 external clock period, the receiving block includes N−1 number of latch blocks in response to the N−1 number of the align control signals, and the data strobe buffering means includes:
       an instruction decoder for generating an initialization pulse for initializing the strobe signal divider in response to the data strobe signal.

16. The semiconductor device as recited in claim 15, wherein the strobe signal divider includes:
    first to forth strobe pulse generators, each for receiving the data strobe signal and generating the align control signals based on the strobe signal sequence; and
    an initial setting block for initializing the first to forth strobe pulse generators,
    wherein the align control signal has the N/2 external clock period.

17. The semiconductor device as recited in claim 15, wherein the data strobe buffering means includes a latency shifter coupled between the instruction decoder and the strobe signal divider for delaying the initialization pulse for a predetermined time.

18. The semiconductor device as recited in claim 15, wherein the data strobe buffering means includes a strobe signal buffer for receiving the data strobe signal and outputting the data strobe signal to the strobe signal divider.

* * * * *